(12) United States Patent
Agarwal et al.

(10) Patent No.: US 10,639,948 B2
(45) Date of Patent: May 5, 2020

(54) ASSEMBLY FOR ATTACHING AN ELECTRONICS PACKAGE TO A TIRE

(71) Applicant: Bridgestone Americas Tire Operations, LLC, Nashville, TN (US)

(72) Inventors: Sheel P. Agarwal, Solon, OH (US); Adam K. Nesbitt, Akron, OH (US)

(73) Assignee: Bridgestone Americas Tire Operations, LLC, Nashville, TN (US)

( * ) Notice: Subject to any disclaimer, the term of this patent is extended or adjusted under 35 U.S.C. 154(b) by 0 days.

(21) Appl. No.: 15/540,876

(22) PCT Filed: Nov. 17, 2015

(86) PCT No.: PCT/US2015/061059
§ 371 (c)(1),
(2) Date: Jun. 29, 2017

(87) PCT Pub. No.: WO2016/109036
PCT Pub. Date: Jul. 7, 2016

(65) Prior Publication Data
US 2017/0355237 A1    Dec. 14, 2017

Related U.S. Application Data

(60) Provisional application No. 62/097,794, filed on Dec. 30, 2014.

(51) Int. Cl.
*B60C 23/00* (2006.01)
*B60C 23/04* (2006.01)
(Continued)

(52) U.S. Cl.
CPC ............ *B60C 23/0493* (2013.01); *F16B 2/22* (2013.01); *H05K 5/0204* (2013.01);
(Continued)

(58) Field of Classification Search
CPC .................................................. B60C 23/0493
See application file for complete search history.

(56) References Cited

U.S. PATENT DOCUMENTS 5,500,065 A * 3/1996 Koch .................. B60C 23/0493
156/123
5,749,984 A    5/1998 Frey et al.
(Continued)

FOREIGN PATENT DOCUMENTS

AU    2012201759    9/2012
DE    10357467    6/2005
(Continued)

OTHER PUBLICATIONS

Search Report and Written Opinion; Corresponding PCT Application No. PCT/US2015/061059, filed Nov. 17, 2015; Authorized Officer Bae, Geun Tae; dated Feb. 16, 2016.
(Continued)

*Primary Examiner* — Daniel P Wicklund
*Assistant Examiner* — Douglas R Burtner

(57) ABSTRACT

An assembly for mounting an electronics package to an interior of a tire includes a carriage configured to receive an electronics package. The assembly also includes an attaching device having a first side and a second side. The first side of the attaching device is permanently affixed to the interior of the tire. The second side of the attaching device has an attaching structure. The attaching structure is configured to receive the carriage to form a secure and locked connection.

11 Claims, 7 Drawing Sheets

(51) Int. Cl.
*F16B 2/22* (2006.01)
*H05K 5/02* (2006.01)
*B29D 30/00* (2006.01)

(52) U.S. Cl.
CPC ............ *B29D 2030/0072* (2013.01); *B29D 2030/0077* (2013.01); *B29D 2030/0083* (2013.01)

(56) References Cited

U.S. PATENT DOCUMENTS

| | | | |
|---|---|---|---|
| 5,960,844 A | 10/1999 | Hamaya | |
| 5,977,870 A | 11/1999 | Rensel et al. | |
| 6,030,478 A | 2/2000 | Koch et al. | |
| 6,217,683 B1* | 4/2001 | Balzer | B60C 23/0493 152/152.1 |
| 6,444,069 B1 | 9/2002 | Koch | |
| 6,462,650 B1* | 10/2002 | Balzer | B60C 23/0493 152/152.1 |
| 6,788,192 B2 | 9/2004 | Shimura | |
| 6,809,700 B2* | 10/2004 | Benedict | B60C 23/0433 343/872 |
| 6,854,324 B2 | 2/2005 | Landes et al. | |
| 6,860,303 B2 | 3/2005 | Rensel et al. | |
| 6,885,291 B1* | 4/2005 | Pollack | B60C 23/0433 116/34 R |
| 6,899,153 B1 | 5/2005 | Pollack et al. | |
| 6,970,076 B1 | 11/2005 | Starkey | |
| 7,040,155 B1 | 5/2006 | Lundell et al. | |
| 7,050,017 B2 | 5/2006 | King et al. | |
| 7,348,878 B2 | 3/2008 | Fogelstrom | |
| 7,513,144 B2 | 4/2009 | Miyoshi | |
| 7,592,902 B2 | 9/2009 | Wilson et al. | |
| 7,707,876 B2 | 5/2010 | Miyoshi | |
| 7,971,477 B2 | 7/2011 | Kubota | |
| 8,157,172 B2 | 4/2012 | Fenkanyn | |
| 8,511,355 B2 | 8/2013 | Kleckner | |
| 8,566,042 B2 | 10/2013 | Wang et al. | |
| 8,640,534 B2 | 2/2014 | Sheikh-Bahaie | |
| 8,661,885 B1 | 3/2014 | Kanwar et al. | |
| 2004/0050170 A1* | 3/2004 | Koch | B60C 23/0493 73/756 |
| 2004/0182494 A1 | 9/2004 | Dominak et al. | |
| 2005/0076982 A1 | 4/2005 | Metcalf et al. | |
| 2005/0126668 A1 | 6/2005 | Fornerod et al. | |
| 2006/0059982 A1* | 3/2006 | Shimura | B60C 23/0493 73/146 |
| 2007/0169865 A1* | 7/2007 | Ichikawa | B60C 19/00 152/152.1 |
| 2007/0251620 A1* | 11/2007 | Perrier | B60C 23/0493 152/152.1 |
| 2008/0083482 A1 | 4/2008 | Logan | |
| 2009/0058667 A1 | 3/2009 | Dixon et al. | |
| 2009/0071249 A1 | 3/2009 | Kitazaki et al. | |
| 2009/0151829 A1 | 6/2009 | Lionetti et al. | |
| 2011/0041309 A1 | 2/2011 | Shepler | |
| 2012/0160409 A1* | 6/2012 | Townsend | B60C 23/0493 156/281 |
| 2012/0188695 A1* | 7/2012 | Yamaguchi | B60C 23/0493 361/679.01 |
| 2012/0204635 A1* | 8/2012 | Kutzscher | B60C 23/0493 73/146.8 |
| 2013/0081457 A1* | 4/2013 | Wilson | G01M 17/02 73/146 |
| 2013/0131915 A1 | 5/2013 | Masago | |
| 2014/0007666 A1* | 1/2014 | Kutzscher | B60C 23/0498 73/146.5 |
| 2014/0060171 A1* | 3/2014 | Hu | B60C 23/0408 73/146.8 |
| 2014/0124636 A1* | 5/2014 | Nagaya | B60C 23/0493 248/205.3 |
| 2014/0352420 A1* | 12/2014 | Brusarosco | B60C 23/0493 73/146.5 |
| 2017/0015149 A1* | 1/2017 | Yamaguchi | B60C 19/00 |
| 2017/0015152 A1* | 1/2017 | Hartmann | B60C 23/0493 |
| 2017/0349010 A1* | 12/2017 | Wilson | B60C 23/0493 |

FOREIGN PATENT DOCUMENTS

| | | | |
|---|---|---|---|
| DE | 102004002150 | 8/2005 | |
| DE | 102011003707 | 8/2012 | |
| EP | 1798074 | 6/2007 | |
| EP | 2186658 | 5/2010 | |
| JP | 2002214060 | 7/2002 | |
| JP | 2004326158 | 11/2004 | |
| JP | 2006234578 | 9/2006 | |
| JP | 2006234579 | 9/2006 | |
| JP | 2006240495 | 9/2006 | |
| JP | 2006240598 | 9/2006 | |
| JP | 2007161031 | 6/2007 | |
| JP | 2007326536 | 12/2007 | |
| JP | 2008230411 | 10/2008 | |
| JP | 2009137497 | 6/2009 | |
| JP | 2009166745 | 7/2009 | |
| JP | 2010507515 | 3/2010 | |
| JP | 2010125920 | 6/2010 | |
| JP | 2010179888 | 8/2010 | |
| JP | 2011020557 A | 2/2011 | |
| JP | 2012245888 A | 12/2012 | |
| JP | 2013039911 A | 2/2013 | |
| KR | 1020040083132 | 10/2004 | |
| KR | 100565029 | 3/2006 | |
| KR | 100672544 | 1/2007 | |
| KR | 20100082464 | 7/2010 | |
| RU | 2388622 | 5/2010 | |
| WO | 2007010755 | 1/2007 | |
| WO | WO-2008133314 A1* | 11/2008 | G01L 19/0618 |
| WO | 2013161762 | 10/2013 | |

OTHER PUBLICATIONS

Search Report; Corresponding EP Application No. 15875886.2; Authorized Officer Karl Billen; dated Jul. 3, 2018.
English Machine Translation of JP2011020557A.
English Machine Translation of JP2012245888A.
English Machine Translation of JP2013039911A.

* cited by examiner

LOCKING CLIP - ON CARRIAGE

LOCKING RING - ON TIRE

ASSEMBLY FOR ATTACHING AN ELECTRONICS PACKAGE TO A TIRE

FIELD OF INVENTION

The present disclosure relates to assemblies for attaching an electronics package to the interior of a tire. More specifically, the present disclosure relates to assemblies for removably attaching an electronics package to an attaching device affixed to the interior surface of a tire.

BACKGROUND

Mounting devices are used to attach objects to a tire, and particularly to an inner liner of a tire. One application is to attach a radio frequency identification ("RFID") tag or chip to the inner liner of a tire. Another application is to secure a pressure or temperature-sensing device to the inner liner of the tire. Various fasteners are used to connect the object to the mounting device, including hook and loop fasteners, threaded connectors, clamps, pins, and snap-fit structures.

SUMMARY

In one embodiment, an assembly for mounting an electronics package to an interior of a tire includes a carriage configured to receive an electronics package. The assembly also includes an attaching device having a first side and a second side. The first side of the attaching device is permanently affixed to the interior of the tire. The second side of the attaching device has an attaching structure. The attaching structure is configured to receive the carriage to form a secure and locked connection.

In another embodiment, an assembly for attaching an electronics package to a tire includes a carriage for receiving an electronics package. A bottom of the carriage has a plurality of through holes. The assembly also includes a clip component having a first side and a second side. The first side of the clip component has a plurality of protruding clips, and the second side of the clip component is configured to be affixed to an interior wall of the tire. The plurality of protruding clips of the clip component mates with the plurality of through holes located in the carriage, removeably affixing the carriage to the clip component.

In yet another embodiment, an assembly for mounting a component to an interior of a tire includes a clip having a first side and a second side. The first side of the clip is affixed to the interior of the tire and the second side of the clip has a plurality of sidewalls protruding therefrom. Each sidewall has a flange. The second side of the clip it configured to removeably receive a component between the flanges.

BRIEF DESCRIPTION OF THE DRAWINGS

In the accompanying drawings, structures are illustrated that, together with the detailed description provided below, describe exemplary embodiments of the claimed invention. Like elements are identified with the same reference numerals. It should be understood that elements shown as a single component may be replaced with multiple components, and elements shown as multiple components may be replaced with a single component. The drawings are not to scale and the proportion of certain elements may be exaggerated for the purpose of illustration.

DETAILED DESCRIPTION

The following includes definitions of selected terms employed herein. The definitions include various examples or forms of components that fall within the scope of a term and that may be used for implementation. The examples are not intended to be limiting. Both singular and plural forms of terms may be within the definitions.

"Axial" and "axially" refer to a direction that is parallel to the axis of rotation of a tire.

"Equatorial plane" refers to the plane that is perpendicular to the tire's axis of rotation and passes through the center of the tire's tread.

"Radial" and "radially" refer to a direction perpendicular to the axis of rotation of a tire.

"Sidewall" refers to that portion of the tire between the tread and the bead.

"Tread" refers to that portion of the tire that comes into contact with the road or ground under normal inflation and load.

Directions are stated herein with reference to the axis of rotation of the tire. The terms "upward" and "upwardly" refer to a general direction towards the tread of the tire, whereas "downward" and "downwardly" refer to the general direction towards the axis of rotation of the tire. Thus, when relative directional terms such as "upper" and "lower" or "top" and "bottom" are used in connection with an element, the "upper" or "top" element is spaced closer to the tread than the "lower" or "bottom" element. Additionally, when relative directional terms such as "above" or "below" are used in connection with an element, an element that is "above" another element is closer to the tread than the other element.

The terms "inward" and "inwardly" refer to a general direction towards the equatorial plane of the tire, whereas "outward" and "outwardly" refer to a general direction away from the equatorial plane of the tire and towards the sidewall of the tire. Thus, when relative directional terms such as "inner" and "outer" are used in connection with an element, the "inner" element is spaced closer to the equatorial plane of the tire than the "outer" element.

Figure 1:
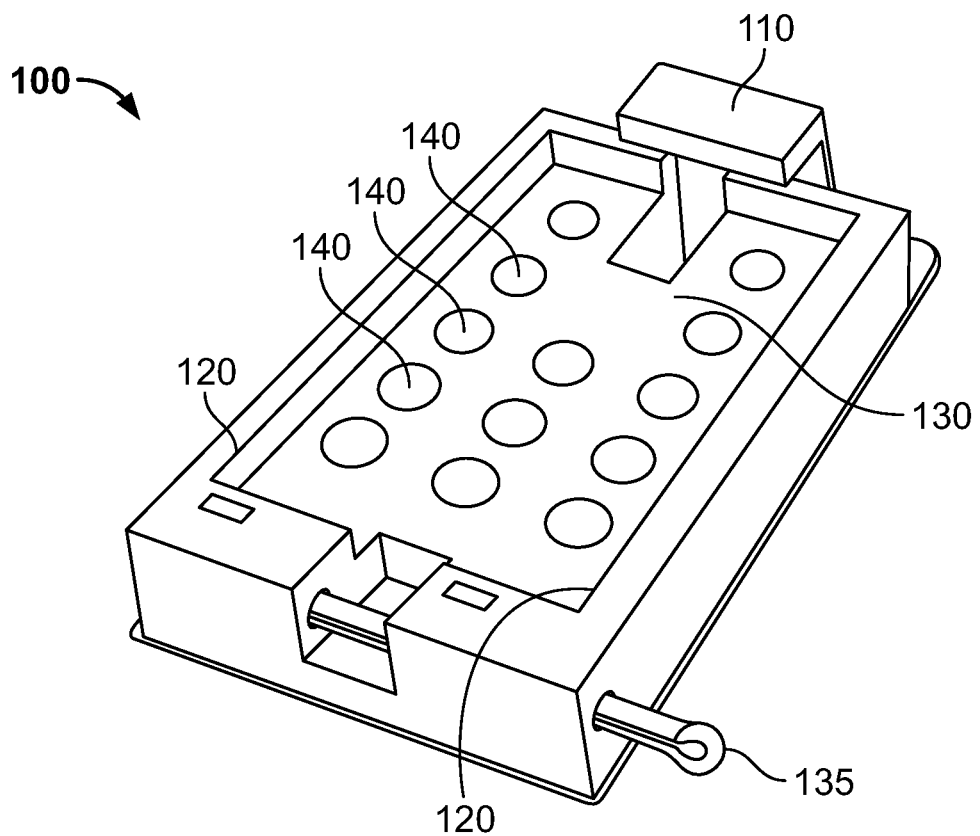
FIG. 1 is a perspective view of one embodiment of a carriage for holding an electronics package.

FIG. 1 shows a perspective view of a carriage 100 for an electronics package. In this embodiment, carriage 100 is generally rectangular and has a rectangular protrusion at one end 110. The carriage 100 has rectangular sidewalls 120 around the perimeter of a rectangular base 130. Through holes 140 are located in the rectangular base 130. The carriage is dimensioned to receive an electronics package, which may be secured in place with a pin 135. Once secured to the carriage 100, the electronics package will remain affixed while the tire is in operation. In other embodiments, the carriage may not include any through holes. In other alternative embodiments, the carriage and carriage components may be shaped as an oval, circle, or any geometric shape.

Figure 2:
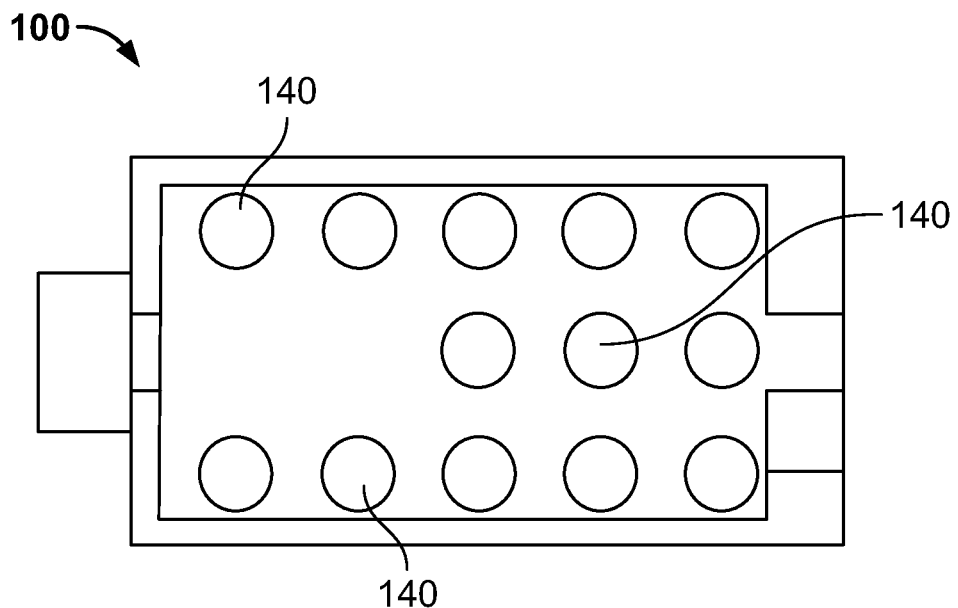
FIG. 2 is a top view of the carriage shown in FIG. 1.

FIG. 2 shows a top view of the carriage 100 and through holes 140. In this figure, carriage 100 has 13 holes, but any number of through holes can be included in alternative embodiments. The carriage 100 can be made from a variety of materials, including high density polyethylene ("HDPE"), low density polyethylene ("LDPE"), thermoplastic polyurethane ("TPU"), thermoplastic elastomer ("TPE"), nylon, or any other polymeric material.

Figure 3:
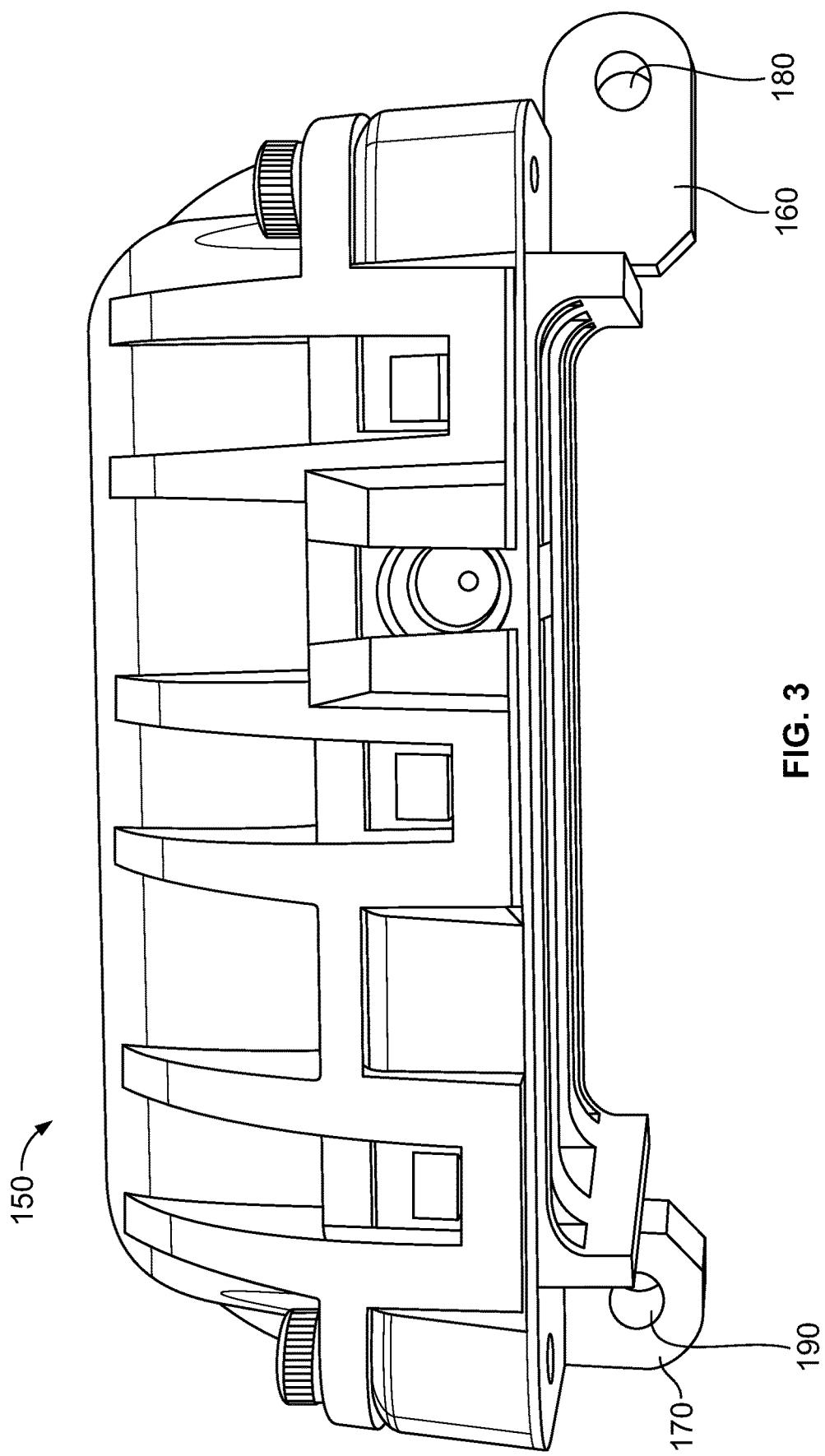
FIG. 3 is a perspective view of an electronics package that can be used with the carriage of FIG. 1.

FIG. 3 shows one embodiment of an electronics package 150 that can be used with carriage 100. The electronics package comprises a hard outer shell that contains various sensors and communication components, which can monitor tire performance characteristics and relay the data to a remote location. In one embodiment, the electronics package 150 is an RFID tag. The electronics package may also include a sensor for measuring an internal temperature of a tire and a transmitter device, such as a radio frequency transmitter. In an alternative embodiment, the electronics package includes a sensor for measuring an internal pressure of a tire and a transmitter device. In another alternative embodiment, the electronics package includes one or more sensors for measuring both an internal temperature and an internal pressure of a tire, as well as a transmitter device. In other alternative embodiments, the electronics package may include accelerometers, stress gauges, strain gauges, sensors for counting tire revolutions, temperature sensors for measuring a temperature of tire materials, sensors for measuring tread depths, or any other known sensors. The electronics package may also include identification information.

Electronics package 150 further includes a first tab 160 located on a bottom of a first end, and a second tab 170 located on a bottom of a second end. First tab 160 and second tab 170 each include a horizontal through hole 180 and 190, respectively.

Figure 4:
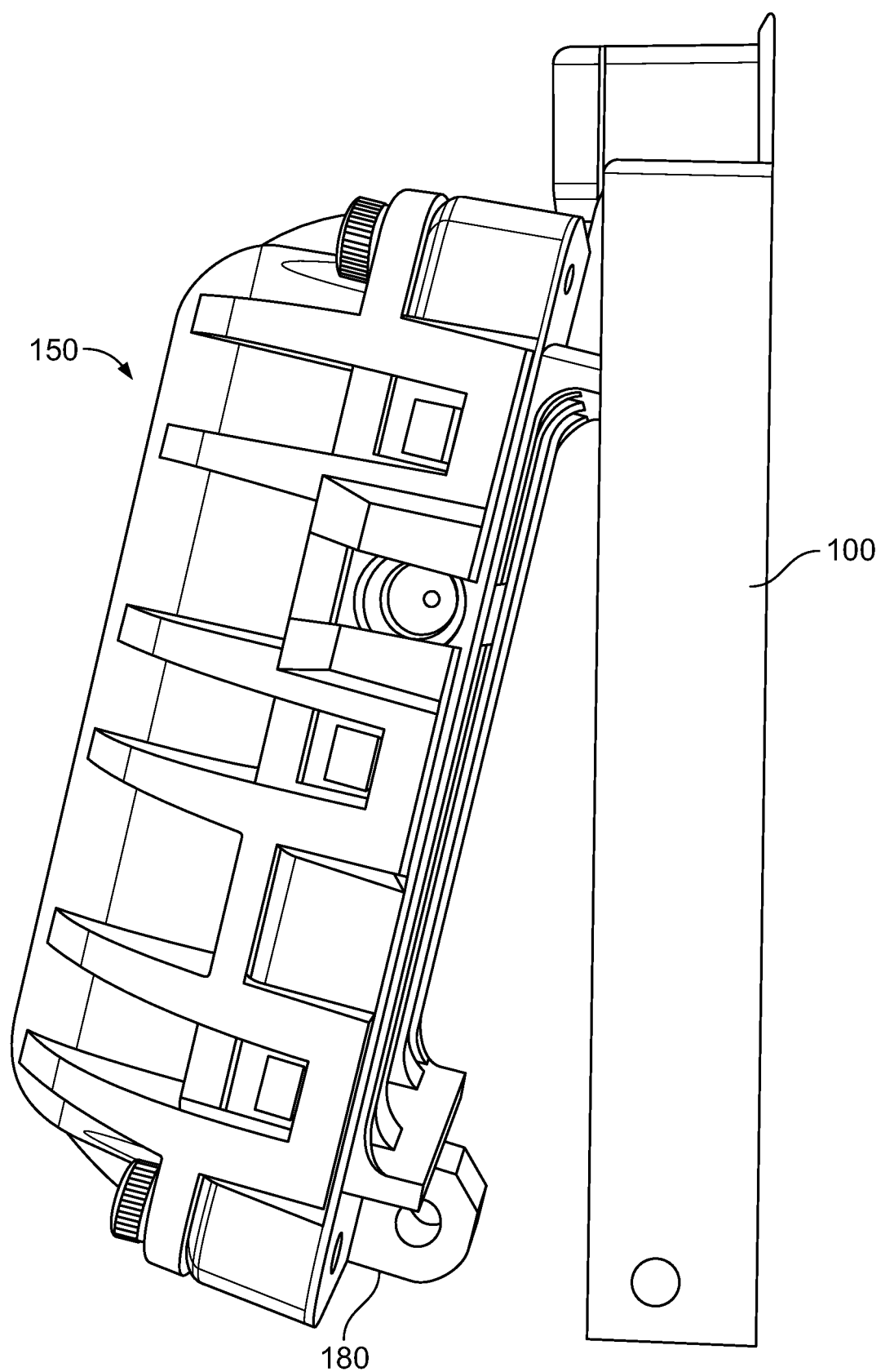
FIG. 4 is a perspective view of the electronics package of FIG. 3, being mounted into the carriage of FIG. 1.

FIG. 4 illustrates the electronics package 150 being mounted to carriage 100. Initially, the first tab 160 of the electronics package is fit into the rectangular protrusion 110 of the carriage 100. Then second tab 180 is aligned with a carriage through hole, and pin 135 is inserted into both the carriage through hole and the second tab through hole 190. In this manner, electronics package is secured to carriage 100.

In alternative embodiments (not shown), the electronics package can be secured to the carriage by other means. For example, the electronics package may be secured to the carriage via a snap-in connection, a buckle, a clamp, a magnet, a tie, a strap, or any other mechanical or electronic connection.

Figure 5:
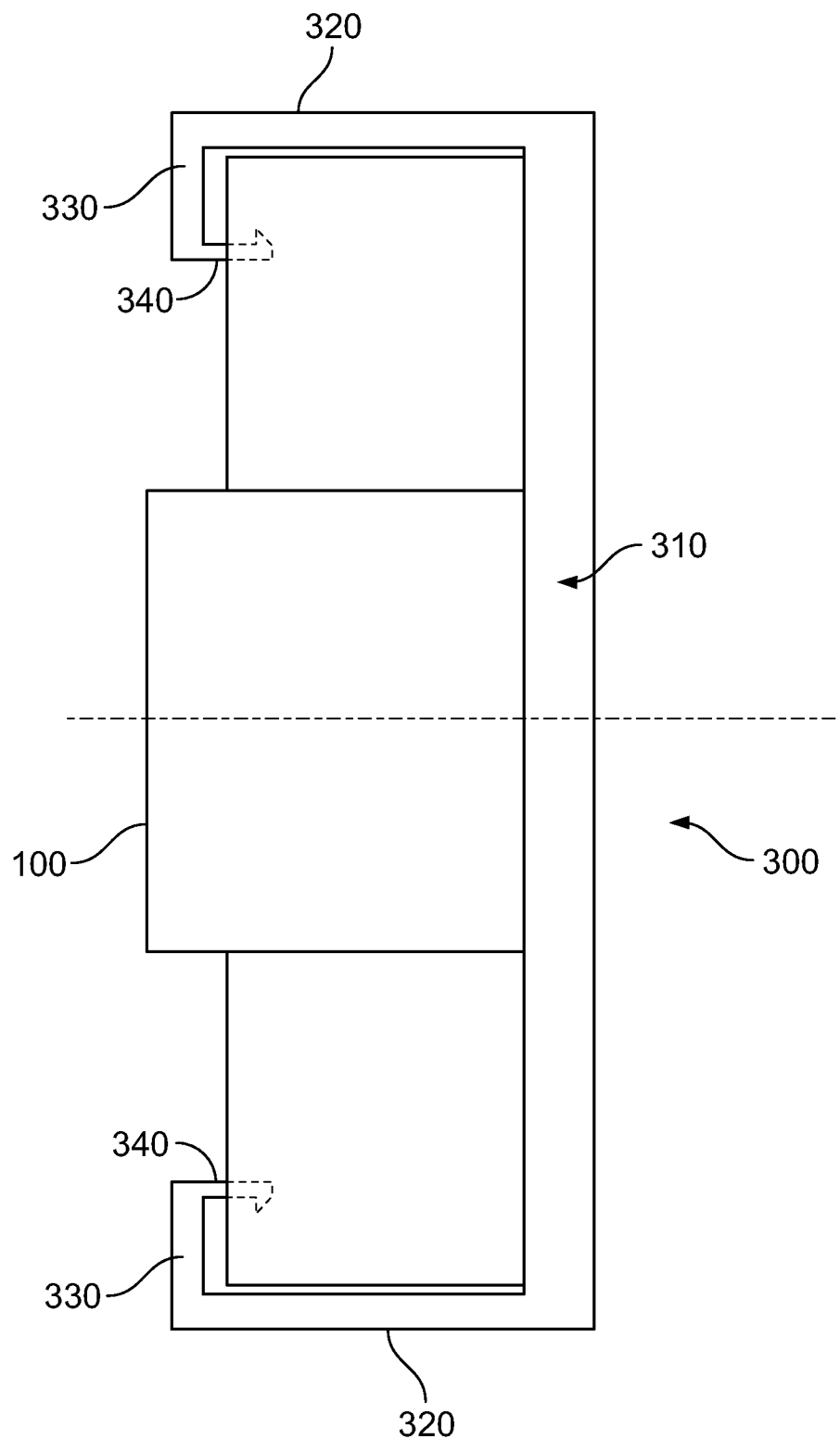
FIG. 5 is a front view of the carriage of FIG. 1, held in place with a first embodiment of an attaching device.

FIG. 5 shows a front view of the carriage 100 secured to one embodiment of an attaching device. In this embodiment, the attaching device is a clip component 300. The clip component 300 has a base 310 affixed to an interior surface of a tire (not shown). The clip component 300 further includes a pair of sidewalls 320 extending from opposite sides of the base 310, with each sidewall 320 having a protruding flange 330. In this embodiment, flanges 330 extend perpendicularly to the sidewalls 320 of clip component 300, and each flange 330 include a tab 340 extending parallel to the sidewalls 320. In other embodiments (not shown), more than two sidewalls, flanges, and/or tabs may be used, and may extend from more than two sides of the clip component 300.

The tabs 340 in this embodiment are hook-shaped and snap around the carriage 300 when the carriage 300 is received between the sidewalls 320. The sidewalls 320, flanges 330, and tabs 340 in this embodiment have a degree of elasticity to allow for ingress and egress of carriage 100. When a user wants to insert the carriage into clip component 300, sidewalls 320, flanges 330 and tabs 340 may be manually pulled apart to allow clearance for carriage 100. Once carriage 100 is positioned, the flanges 330 and tabs 340 are released to return to the position shown in FIG. 5, thereby securing the carriage 100 to the clip component 300. In alternative embodiments (not shown), other structures may be used to secure the carriage instead of tabs, such as a clamping device, a locking pin, screws, or any other type of fastener.

In one embodiment, the clip component 300 can be affixed to the interior of a cured tire using a dual cure cement or dual cure gum. In other embodiments, other cements, gums, or adhesives may be used to bond the clip component 300 to the interior of the tire. In an alternative embodiment, the clip component 300 may be cured into the surface of the tire interior during a curing process. In further alternative embodiments, the clip component may be affixed to the surface of the tire interior using mechanical fasteners or magnets affixed to both the tire interior and the clip component.

The clip component 300 may be affixed to the interior of the tire at an affixation position selected by a designer. The affixation position may be selected based on properties of a specific tire type. For example, a tire may be tested to determine stresses, strains, vibrations, temperatures, and other characteristics at various locations during operation of the tire. A location with minimal stresses and strains may be a desirable affixation position, because such a location will minimize the stresses put on the mounting apparatus. Alternatively, a location with maximum stresses and strains may be a desirable affixation position, because an operator may wish to monitor a tire at a location where it is most likely to fail if operating conditions are too severe. Other desirable affixation positions will be apparent to those skilled in the art and include those positions at which an electronic device may transmit a signal to a receiver, without damage to the tire, the electronic device, or the mounting apparatus. The affixation location in the belt area may be a desirable location if the belt does not interfere with transmission.

Figure 6:
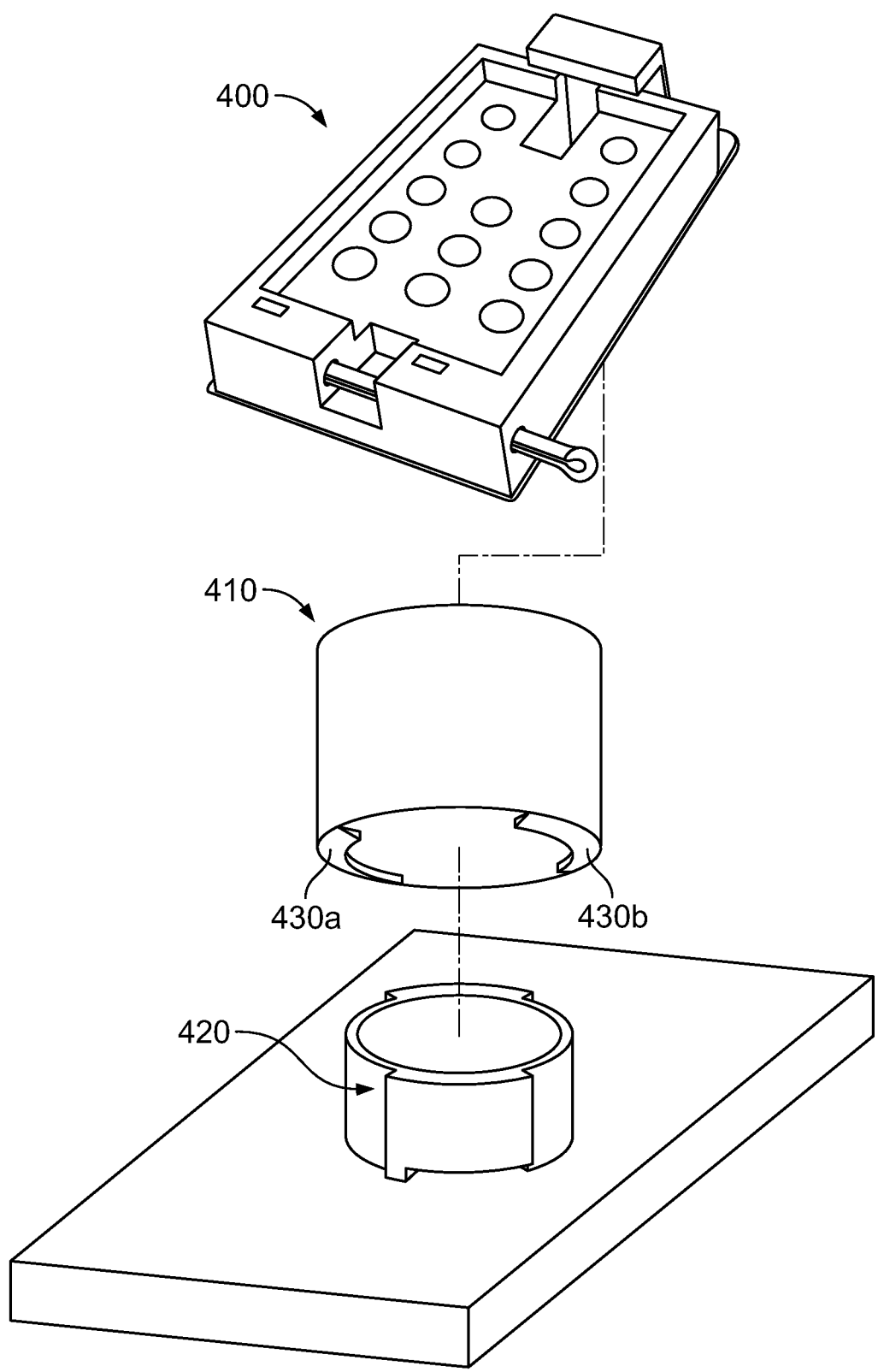
FIG. 6 is a perspective view of another embodiment of a carriage, with a locking clip and locking ring.
Figure 7A:
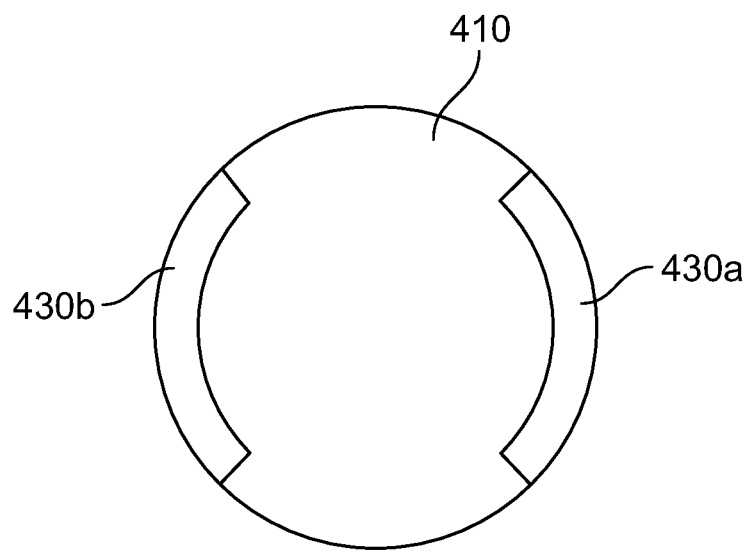
FIG. 7A is a top view of the locking clip shown in FIG. 6.
Figure 7B:
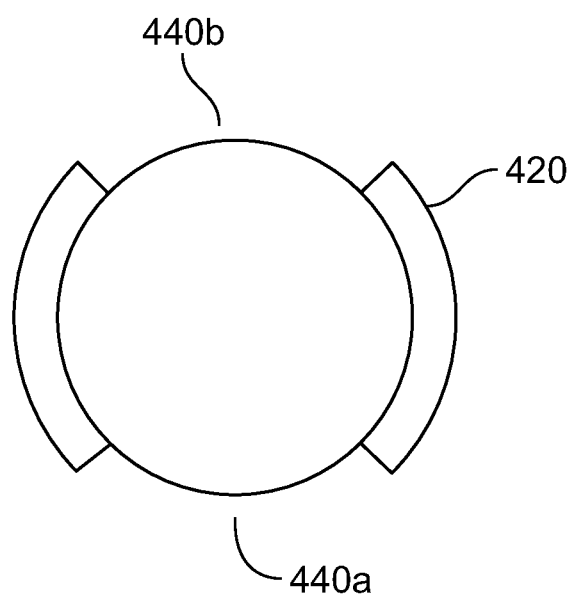
FIG. 7B is a top view of a locking ring for use with the locking clip of FIG. 7A.

FIG. 6 is a perspective view of an alternative embodiment of an attaching device and an alternative carriage 400. In this embodiment, the attaching device includes a cylindrical locking clip 410 extending downwardly from the carriage 400 and a corresponding cylindrical locking ring 420 extending upwardly from an attaching device secured to an interior surface of a tire. Together, the locking clip 410 and the locking ring 420 form a secure locked connection when engaged with each other. Carriage 400 in this embodiment is shaped similarly to the carriage 100 of FIG. 1, but may take any other geometric shape in alternative embodiments (not shown).

Locking clip 410 is affixed to carriage 400, and can be affixed as a separate piece or formed integrally with carriage 400. Locking ring 420 is part of an attaching device that can be affixed to an interior surface of a tire via an adhesive, a magnet or other mechanical connection. Further, locking ring 420 can be cured with the tire to form an integral connection between locking ring 420 and the interior surface of the tire.

Locking clip 410 includes two ramps 430a and 430b that correspond with two ramps 440a and 440b of the locking ring 420. Locking clip 410 is dimensioned to fit onto locking ring 420, such that ramps 430a and 430b are aligned with 440a and 440b, respectively. When locking clip 410 is rotated, the ramps engage each other, and create a locking connection between the locking clip 410 and the locking ring 420.

The ramps in this embodiment each individually cover approximately 25% of the circumference of the respective locking clip and locking ring. This corresponds to a 90° rotation for locking the locking clip into the locking ring. In alternative embodiments, the ramps may cover more or less of the circumference of the respective locking clip and locking ring, such that the locking clip can be rotated anywhere from 0 to 360 degrees to form a locking connection.

In alternative embodiments (not shown) the locking clip and locking ring may include more or fewer ramps, or no ramps. In an embodiment where no ramps are used, an alternative structure may be implemented to create a locking connection, such as a tab and slot or a spring loaded pin.

In another alternative embodiment (not shown), one of the locking clip and the locking ring may include tabs at the end of the respective ramps, and the other of the locking clip and the locking ring may include recesses configured to receive the tabs at the ends of the corresponding ramps. The tabs will fit into the recesses as the locking clip is rotated with the locking ring, to form a secure locking connection.

In still other alternative embodiments, the locking clip and locking ring are not cylindrical, and instead can take the form of any polygonal or non-polygonal shape.

Figure 8:
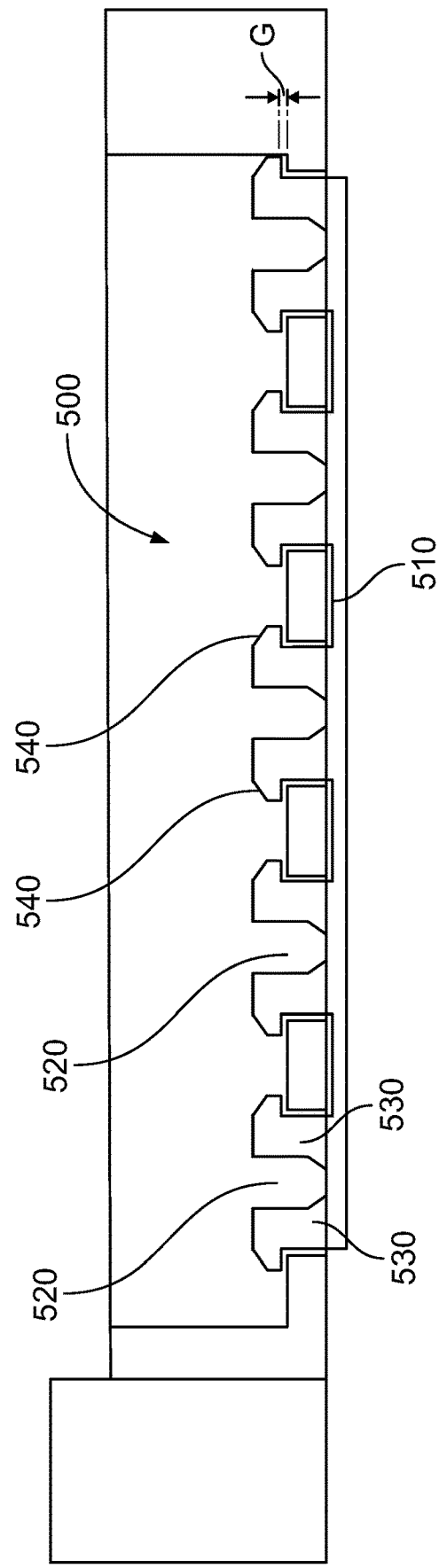
FIG. 8 is a cross section of another alternative embodiment of an attaching device, with a plurality of mushroom-like clips.

The embodiment of FIG. 8 illustrates an alternative attaching device 510, which utilizes a plurality of clips 520 to secure carriage 500. Carriage 500 in this embodiment is substantially similar to the carriage 100 of FIG. 1, but may take any geometric shape. In this embodiment, the plurality of clips 520 fit through a plurality of holes located in carriage 500 to provide a secure connection. Clips 520 in this embodiment are mushroom-shaped clips, and each includes a cut-out portion along a diameter of the clip, with two protruding flanges 530 that can be bent elastically inward to fit through holes in the carriage 500. Tabs 540 are located on top of flanges 530, and are sized to fit through the holes in carriage 500 when the flanges are bent inwardly. Once the clips 520 are fit through holes, they can be released and will return to the state shown in FIG. 8. When in this state, the distance between each tab 540 on a single clip 520 is greater than the diameter of the carriage hole, so that the carriage 500 cannot be removed from the attaching device 510 unless the clips 520 are bent inwardly by a user.

When clips 520 are engaged with the carriage 500, a gap G is formed between the bottom of tabs 540 and the top of the lower surface of carriage 500. The holes of carriage 500 have a greater diameter than the clips 530, and will cause play between the carriage 500 and the attaching device 510. However, the holes in carriage 500 have a diameter less than the distance between tabs 540, so that the carriage 500 cannot be removed from attaching device 510 without manually bending the flanges 520.

In alternative embodiments, there is no gap between the bottom of tabs 540 and a top of the lower surface of the carriage, such that G=0. In further alternative embodiments, the clips 520 may take a different form instead of mushroom clips. For example, the clips may be one-sided mushroom type clips, pins, lag bolt type fasteners, or other fasteners.

To the extent that the term "includes" or "including" is used in the specification or the claims, it is intended to be inclusive in a manner similar to the term "comprising" as that term is interpreted when employed as a transitional word in a claim. Furthermore, to the extent that the term "or" is employed (e.g., A or B) it is intended to mean "A or B or both." When the applicants intend to indicate "only A or B but not both" then the term "only A or B but not both" will be employed. Thus, use of the term "or" herein is the inclusive, and not the exclusive use. See, Bryan A. Garner, A Dictionary of Modern Legal Usage 624 (2d. Ed. 1995). Also, to the extent that the terms "in" or "into" are used in the specification or the claims, it is intended to additionally mean "on" or "onto." Furthermore, to the extent the term "connect" is used in the specification or claims, it is intended to mean not only "directly connected to," but also "indirectly connected to" such as connected through another component or components.

While the present disclosure has been illustrated by the description of embodiments thereof, and while the embodiments have been described in considerable detail, it is not the intention of the applicants to restrict or in any way limit the scope of the appended claims to such detail. Additional advantages and modifications will readily appear to those skilled in the art. Therefore, the disclosure, in its broader aspects, is not limited to the specific details, the representative apparatus and method, and illustrative examples shown and described. Accordingly, departures may be made from such details without departing from the spirit or scope of the applicant's general inventive concept.

What is claimed is:

1. An assembly for mounting an electronics package to an interior of a tire, comprising:
   a carriage having a base extending between two pairs of opposing sidewalls, thereby defining a recess configured to removably receive an electronics package, wherein the base of the carriage includes a plurality of through holes disposed therein;
   an attaching device having a first side and a second side;
   the attaching device first side being permanently affixed to the interior of the tire;
   the attaching device second side having an attaching structure;
   wherein the attaching structure is configured to receive the carriage to form a secure and locked connection.

2. The assembly of claim 1, wherein the attaching structure is a locking clip.

3. The assembly of claim 2, wherein the carriage further includes a locking ring that is configured to mate with the locking clip.

4. The assembly of claim 3, wherein the locking clip is configured to mate with the locking ring by rotating the locking clip in the locking ring.

5. The assembly of claim 3, wherein the locking ring and the locking clip each include a ramped element.

6. The assembly of claim 1, wherein one of the attaching structure and the carriage includes a tab, and the other of the attaching structure and the carriage is configured to receive the tab.

7. The assembly of claim 1, wherein the attaching device is a clip, and the attaching structure includes a plurality of sidewalls having a plurality of flanges and a plurality of tabs configured to receive the carriage.

8. The assembly of claim 7, wherein the tabs are hook-shaped.

9. The assembly of claim 1, further including an electronics package;
   wherein a wall of the carriage includes a through hole;
   wherein the electronics package includes a through hole; and wherein the electronics package is affixed to the carriage via a pin extending through the through hole of the wall of the carriage and the through hole of the electronics package.

10. The assembly of claim 1, wherein the two pairs of opposing sidewalls define a rectangular shape.

11. The assembly of claim 1, wherein the carriage has a rectangular protrusion at one end.

\* \* \* \* \*